United States Patent [19]

Sugibayashi et al.

[11] Patent Number: 5,289,061
[45] Date of Patent: Feb. 22, 1994

[54] OUTPUT GATE FOR A SEMICONDUCTOR IC

[75] Inventors: Tadahiko Sugibayashi; Yasuji Koshikawa; Ryuji Yamamura, all of Tokyo, Japan

[73] Assignee: NEC Corporation, Tokyo, Japan

[21] Appl. No.: 937,055

[22] Filed: Aug. 26, 1992

[30] Foreign Application Priority Data

Aug. 27, 1991 [JP] Japan .................................. 3-214926

[51] Int. Cl.$^5$ ........................................... H03K 5/00
[52] U.S. Cl. ...................................... 307/571; 307/584; 307/585
[58] Field of Search ............... 307/571, 584, 585, 572, 307/451, 443

[56] References Cited

U.S. PATENT DOCUMENTS

| | | | |
|---|---|---|---|
| 4,721,866 | 1/1988 | Chi et al. | 307/584 |
| 4,914,326 | 4/1990 | Kikuda et al. | 307/585 |
| 4,987,324 | 1/1991 | Wong et al. | 307/443 |
| 5,063,313 | 11/1991 | Kikuda et al. | 307/585 |
| 5,068,553 | 11/1991 | Love | 307/585 |
| 5,146,120 | 9/1992 | Kimura et al. | 307/572 |
| 5,155,382 | 10/1992 | Madden et al. | 307/571 |
| 5,187,686 | 2/1993 | Tran et al. | 307/585 |

*Primary Examiner*—John T. Kwon
*Attorney, Agent, or Firm*—Laff, Whitesel, Conte & Saret

[57] ABSTRACT

An output gate according to the present invention includes a CMOS gate composed of a P-MOS transistor connected at a source to an external power supply and a first N-MOS transistor connected at a source to ground, and a second N-MOS transistor connected between ground and the first N-MOS transistor by a source-drain path. The second N-MOS transistor is connected at a gate to an external power supply.

6 Claims, 4 Drawing Sheets

OUTPUT GATE FOR A SEMICONDUCTOR IC

FIELD OF THE INVENTION

This invention relates to an output gate for a semiconductor integrated circuit (IC), and more particularly to, an output gate for a semiconductor IC having an internal power supply.

BACKGROUND OF THE INVENTION

Recently, a semiconductor integrated circuit (IC) such as a dynamic RAM is provided with an internal power supply by which the IC is driven. In this situation, a semiconductor IC is required to supply an output signal which is adapted to another IC driven by only an external power supply. Accordingly, a conventional semiconductor IC has an output gate for converting an output signal of an internal power supply level to an output signal of an external power supply level.

A first conventional output gate which is of a CMOS (complementary metal-oxide semiconductor) logic gate is composed of a P-MOS transistor connected at a source to an external power supply and an N-MOS transistor connected at source to ground. The common P-and-N MOS transistor are supplied at an input node of a common gate with an output signal of an internal circuit driven by an internal power supply.

In the first conventional output gate, when a signal of low level is supplied to the input node of the common gate, the P-MOS transistor is turned on and the N-MOS transistor is turned off, so that an output signal of the external power supply level is supplied from the output gate. On the other hand, when a signal of high level is supplied to the input node of the common gate, the P-MOS transistor is turned off and the N-MOS transistor is turned on, so that an output signal of ground level is supplied from the output gate.

According to the first conventional output gate, there is a disadvantage in that the first P-MOS transistor is not turned off completely even though a high level signal is supplied thereto, in such a state that the internal power supply level $V_{IN\ T}$ on which the supplied high level signal is based, and the Vcc meet the relation of "$Vcc > V_{IN\ T} + V_{TP}$", where $V_{TP}$ is a threshold voltage of the P-MOS transistor. As a result, a margin of the external power supply voltage is narrow.

A second conventional output gate by which the disadvantage of the first conventional output gate is removed includes a first P-MOS transistor and a first N-MOS transistor corresponding to the P-and-N MOS transistors of the first conventional output gate, a second N-MOS transistor connected at a gate to an internal power supply, at a source to a first node to which an input signal is supplied and at a drain to a second node which is connected to a gate of the first P-MOS transistor, and a second P-MOS transistor connected at a source to an external power supply, at a gate to an output of the CMOS gate and at a drain to the second node. The second P-MOS transistor supplies a feedback signal of an inverted level of the output signal to the gate of the first P-MOS transistor.

In the second conventional output gate, when the output signal of low level which is based on the high level input signal supplied through the second N-MOS transistor is supplied from the output gate to the second P-MOS transistor, it is turned on, so that a high level signal of the external voltage Vcc is supplied to the gate of the first P-MOS transistor through the second P-MOS transistor. Therefore, the first P-MOS transistor is completely turned off.

However, there is a disadvantage in that a transition time of the output signal "high" to "low" is long, because the first P-MOS transistor is not turned off completely before the external power supply voltage is supplied to the gate of the first P-MOS transistor. Therefore, a margin of the external power supply voltage of the semiconductor IC is narrow.

SUMMARY OF THE INVENTION

Accordingly, it is an object of the invention to provide an output gate for a semiconductor IC in which a margin of the external power supply is wide.

According to the invention, an output gate for a semiconductor IC, includes:

a P-MOS transistor connected at a gate to a first nodal point to which input signal is supplied, at a source to an external power supply and at a drain to a second nodal point from which an output signal is supplied;

a first N-MOS transistor connected at a gate to the first nodal point and at a drain to the second nodal point; and a second N-MOS transistor connected at a gate to the external power supply, at a source to ground and at a drain to a source of the first N-MOS transistor;

wherein the input signal is generated in an internal circuit which is driven by an internal power supply.

The other objects and features of this invention will become understood from the following description with reference to the accompanying drawings.

DESCRIPTION OF THE PREFERRED EMBODIMENTS

For better understanding the background of the present invention, the basic principle of the conventional technology is first described hereinafter with reference to FIGS. 1 and 2.

Figure 1:
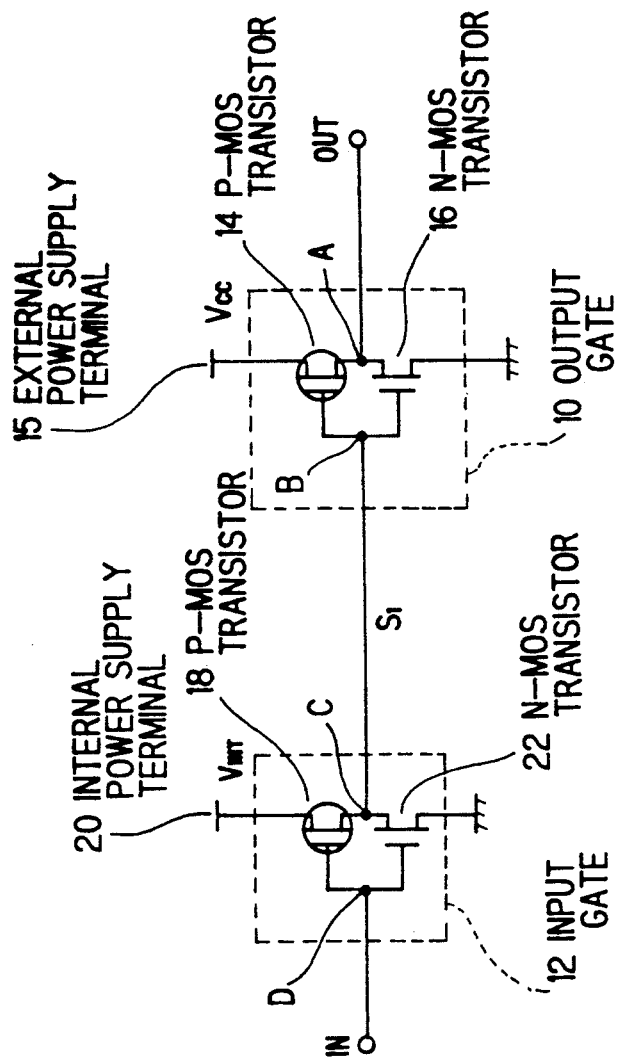
FIG. 1 is a circuit diagram showing a first conventional output gate.

FIG. 1 shows a first conventional semiconductor IC which includes an input CMOS gate 12 to which an input signal IN is supplied, and an output CMOS gate 10 from which an output signal OUT having an amplitude of zero to Vcc is supplied.

The input gate 12 includes a P-MOS transistor 18 connected at a source to an internal power supply terminal 20, at a drain to a node C and at a gate to a node D, and an N-MOS transistor 22 connected to a source to ground, at a drain to the node C and at a gate to the node D. The internal power supply terminal 20 is applied with an internal voltage $V_{I\ NT}$. The input gate 12 supplies an output signal S1 having an amplitude of zero to $V_{IN\ T}$ to the output gate 10.

The output gate 10 includes a P-MOS transistor 14 connected at a source to an external power supply terminal 15, at a drain to a node A and at a gate to a node B, and an N-MOS transistor 16 connected to a source to ground, at a drain to the node A and at a gate to the node B. The external power supply terminal 15 is applied with an external voltage Vcc.

In operation, when the input signal IN of high level is supplied to the input gate 12, the signal S1 of low level is supplied therefrom to the output gate 10. In response to the signal S1, the P-MOS transistor 14 is turned on and the N-MOS transistor 16 is turned off, so that the output signal OUT of high level is supplied to the following stage.

On the other hand, when the input signal IN of low level is supplied to the input gate 12, the signal S1 of high level is supplied therefrom to the output gate 10. In response to the signal S1, the P-MOS transistor 14 is turned off and the N-MOS transistor 16 is turned on, so that the output signal of low level is supplied to the following stage. In this case, if the external power supply voltage Vcc is higher than the sum of the internal power supply voltage $V_{INT}$ and a threshold voltage $V_{Tp}$ of the P-MOS transistor 14, as described before, the P-MOS transistor 14 is not turned off completely.

Figure 2:
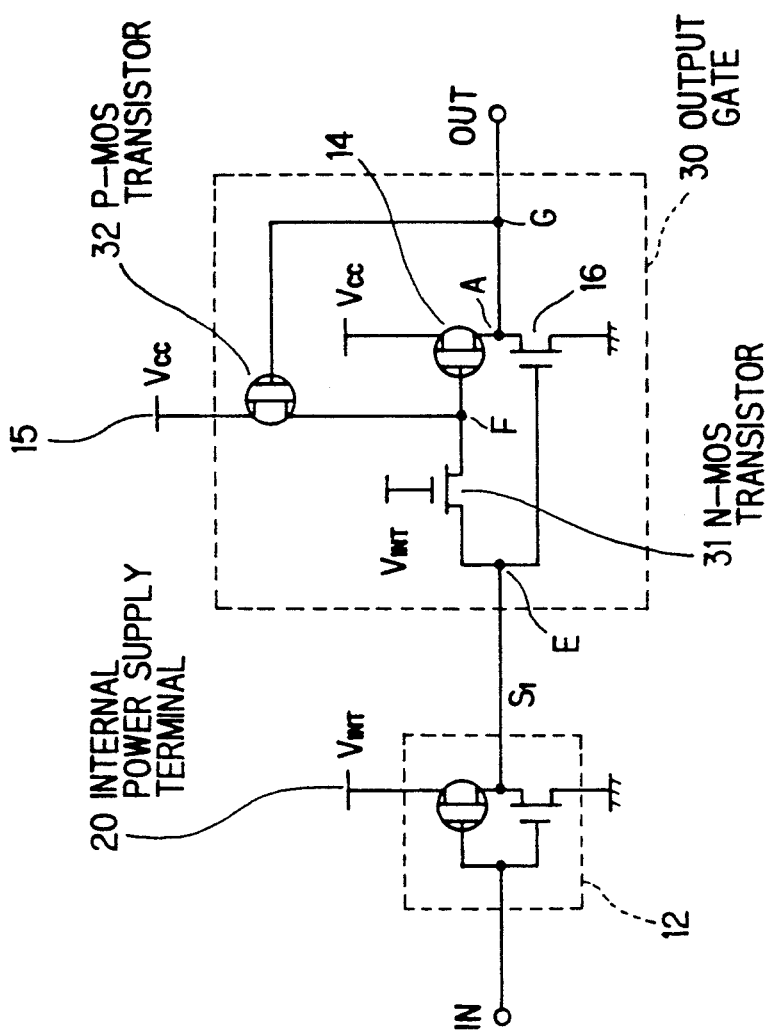
FIG. 2 is a circuit diagram showing a second conventional output gate.

FIG. 2 shows a semiconductor IC using a second conventional output gate 30 by which the disadvantage of the first conventional output gate 10 is removed.

The output gate 30 further includes an N-MOS transistor 31, a P-MOS transistor 32, in addition to the P-and-N MOS transistors 14 and 16 of the first conventional circuit. The N-MOS transistor 31 is connected at a gate to an internal power supply $V_{INT}$, at a source to a node E and at a drain to a node F. The P-MOS transistor 32 is connected at a source to an external power supply terminal 15, at a gate to a node G and at a drain to the node F. The P-MOS transistor 32 is for supplying an inverted signal of an output signal OUT to a gate of an P-MOS transistor 14. In this circuit, the N-MOS transistor 31 is provided for the purpose of transfer and isolation, and the P-MOS transistor 32 is for the purpose of feedback and signal level conversion.

In the second conventional output gate 30, when a signal S1 of high level is supplied to the node E, an N-MOS transistor 16 is turned on. At the same time, a high level signal of the internal power supply voltage $V_{INT}$ is supplied to the gate of the P-MOS transistor 14 through the N-MOS transistor 31, so that the P-MOS transistor 14 is turned off. Therefore, the output signal OUT of low level is supplied from the output gate 30. At this time, a low level signal is supplied to the gate of the P-MOS transistor 32 through the node G, so that the P-MOS transistor 32 is turned on. Therefore, a high level signal of the external power supply voltage Vcc is applied to the gate of the P-MOS transistor 14, so that the P-MOS transistor 14 is completely turned off.

According to the second conventional output gate 30, the problem of the first conventional one 10 is removed. However, there is a disadvantage in that a transition time of the output signal OUT "high" to "low" is longer. The reason is based on a phenomenon that a load driving ability of the P-MOS transistor 14 is proportional to "$(Vcc+V_{TP})^2$" and that of the N-MOS transistor 16 is proportional to "$V_{INT}+V_{TN}$", where "$V_{TP}$" and "$V_{TN}$" are threshold voltage levels of the P-MOS transistor 14 and the N-MOS transistor 16, respectively. Thus, as the external power supply voltage Vcc becomes high, the transition time becomes long. As a result, a margin of the external power supply voltage is narrow.

Figure 3:
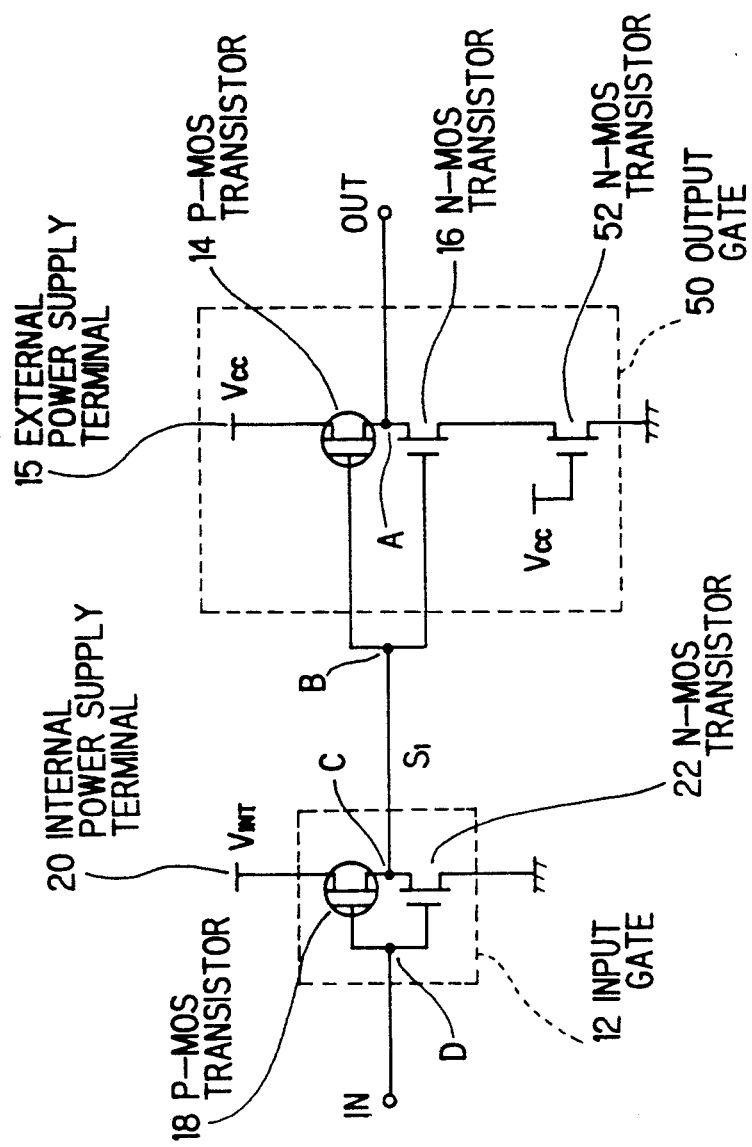
FIG. 3 is a circuit diagram showing an output gate of a first preferred embodiment according to the invention.

FIG. 3 shows a semiconductor IC using an output gate 50 of a first preferred embodiment according to the invention. The semiconductor IC includes the output gate 50 from which an output signal OUT is supplied, and an input gate 12 to which an input signal IN is supplied.

The input gate 12 includes a P-MOS transistor 18 connected at a source to an internal power supply terminal 20, at a drain to a node C and at a gate to a node D, and an N-MOS transistor 22 connected to a source to ground, at a drain to the node C and at a gate to the node D. The internal power supply terminal 20 is applied with an internal power supply voltage $V_{INT}$. The input gate 12 supplies an output signal S1 having an amplitude of zero to $V_{INT}$ to the output gate 50.

The output gate 50 includes a P-MOS transistor 14 connected at a source to an external power supply terminal 15, at a drain to a node A and at a gate to a node B, an N-MOS transistor 16 connected at a drain to the node A and at a gate to the node B, and an N-MOS transistor 52 connected at a gate to the external power supply Vcc, at a source to ground and at a drain to a source of the N-MOS transistor 16. The external power supply terminal 15 is applied with the external power supply voltage Vcc, so that the output gate 10 supplies the output signal OUT having an amplitude of zero to Vcc.

In the output gate 50, a ratio of a channel-length to a channel-width of the N-MOS transistor 16 is determined to be sufficiently larger than that of the N-MOS transistor 52 so that a driving ability of the N-MOS transistor 16 is proportional to "$(Vcc-V_{TN})^2$", where "$V_{TN}$" is a threshold level of the N-MOS transistor 16.

In operation, when the input signal IN of high level is supplied to the input gate 12, the signal S1 of low level is supplied therefrom to the output gate 50. In response to the signal S1, the P-MOS transistor 14 is turned on and the N-MOS transistor 16 is turned off, so that the output signal OUT of high level is supplied to the following stage.

On the other hand, when the input signal IN of low level is supplied to the input gate 12, the signal S1 of high level is supplied to the output gate 50. In response to the signal S1, the P-MOS transistor 14 is turned off and the N-MOS transistor 16 is turned on, so that the output signal OUT of low level is supplied to the following stage through the N-MOS transistors 52 and 16.

According to the first preferred embodiment, a transition time of the output signal OUT "high" to "low" is short, because the driving ability of the P-MOS transistor 14 is proportional to "$(Vcc+V_{TP})^2$" and that of the N-MOS transistor 16 is proportional to "$(Vcc-V_{TN})^2$", where "$V_{TP}$" and "$V_{TN}$" are threshold voltage levels of the P-MOS transistor 14 and the N-MOS transistor 16, respectively.

Further, generally, the threshold levels of the P-MOS transistor 14 and the N-MOS transistor 16 are equal, so that the transition time of the output signal OUT "high" to "low" is equal to that of "low" to "high". As a result, a margin of the external power supply voltage Vcc becomes wide.

Figure 4:
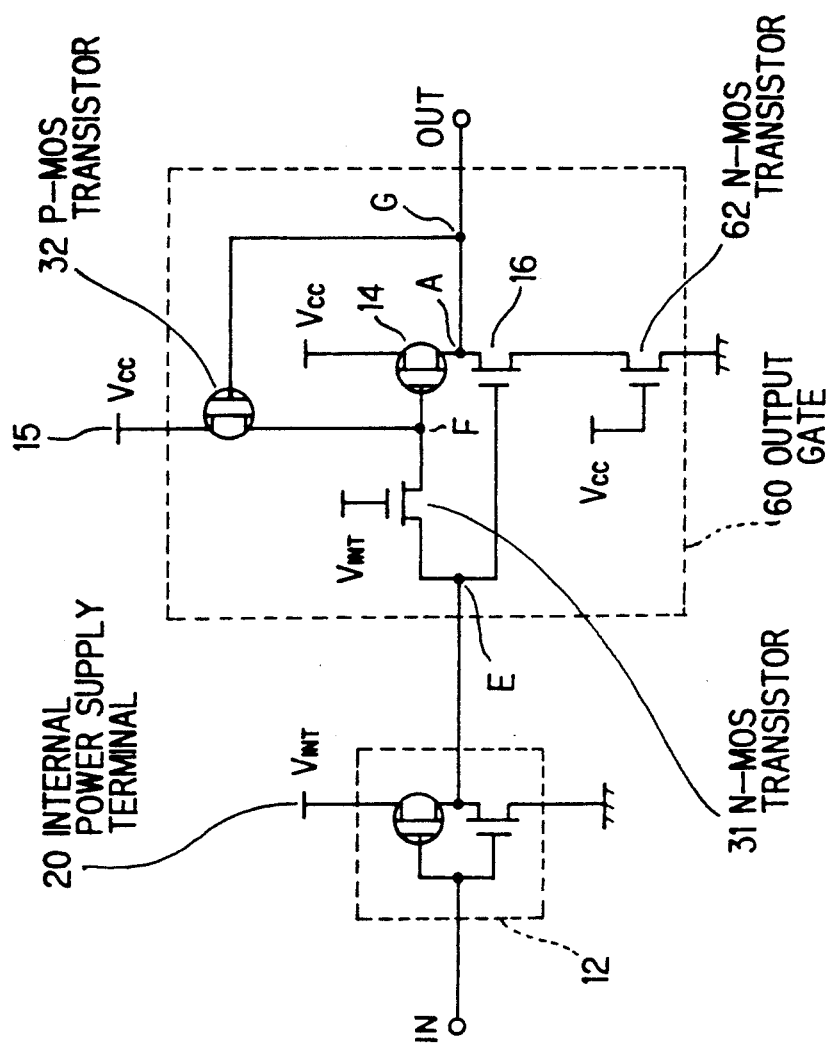
FIG. 4 is a circuit diagram showing an output gate of a second preferred embodiment according to the invention.

FIG. 4 shows a semiconductor IC using an output gate 60 of a second preferred embodiment according to the invention. In this embodiment, explanation of the same structure and the same operation as the first preferred embodiment is omitted.

The output gate 60 further includes an N-MOS transistor 31, a P-MOS transistor 32 and an N-MOS transistor 62. The N-MOS transistor 31 is connected at a gate to an internal power supply $V_{INT}$, at a source to a node E and at a drain to a node F. The P-MOS transistor 32 is connected at a source to an external power supply terminal 15, at a gate to a node G and at a drain to the node F. The P-MOS transistor 32 is for supplying an inverted signal of an output signal OUT to a gate of an P-MOS transistor 14. The N-MOS transistor 62 is connected at a gate to the external power supply Vcc, at a source to ground and at a drain to a source of an N-MOS transistor 16.

According to the second preferred embodiment, in the same manner as the first preferred embodiment, a transition time of the output signal OUT "high" to "low" is short, so that a margin of the external power supply voltage Vcc is wide.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. An output gate for a semiconductor IC, comprising:
    a P-MOS transistor connected at a gate to a first nodal point to which input signal is supplied, at a source to an external power supply and at a drain to a second nodal point from which an output signal is supplied;
    a first N-MOS transistor connected at a gate to said first nodal point and at a drain to said second nodal point; and
    a second N-MOS transistor connected at a gate to said external power supply, at a source to ground and at a drain to a source of said first N-MOS transistor;
    wherein said input signal is generated in an internal circuit which is driven by an internal power supply.

2. An output gate for a semiconductor IC, according to claim 1, wherein:
    in said first N-MOS transistor, a ratio of a channel-length to a channel-width is determined to be sufficiently larger than that of said second N-MOS transistor.

3. An output gate for a semiconductor IC, comprising:
    a first P-MOS transistor connected at a gate to a first nodal point, at a source to an external power supply and at a drain to a second nodal point from which an output signal is supplied;
    a first N-MOS transistor connected at a gate to a third nodal point to which an input signal is supplied and at a drain to said second nodal point;
    a second N-MOS transistor connected at a gate to said external power supply, at a source to ground and at a drain to a source of said first N-MOS transistor;
    a second P-MOS transistor connected at a gate to said second nodal point, at a source to said external power supply and at a drain to said first nodal point; and
    a third N-MOS transistor connected at a gate to said external power supply, at a source to said first nodal point and at a drain to said third nodal point;
    wherein said input signal is generated in an internal circuit which is driven by an internal power supply.

4. An output gate for a semiconductor IC, according to claim 3, wherein:
    in said first N-MOS transistor, a ratio of a channel-length to a channel-width is determined to be sufficiently larger than that of said second N-MOS transistor.

5. A CMOS logic gate, comprising:
    a first CMOS logic gate for inverting an input signal to provide an inverted signal in accordance with a logic level ranging ground potential to an internal power supply potential;
    a second CMOS logic gate for inverting said inverted signal to provide an output signal in accordance with a logic level ranging ground potential to an external power supply potential; and
    means for accelerating a transition of said output signal from said external power supply potential to said ground potential.

6. A CMOS logic gate, according to claim 5, wherein:
    said accelerating means is an N-MOS transistor connected between said second CMOS logic gate and said ground potential by a source and drain path and at a gate to said external power supply potential.

* * * * *